United States Patent [19]

LeGall

[11] Patent Number: 4,829,378

[45] Date of Patent: May 9, 1989

[54] SUB-BAND CODING OF IMAGES WITH LOW COMPUTATIONAL COMPLEXITY

[75] Inventor: Didier J. LeGall, Springfield, N.J.

[73] Assignee: Bell Communications Research, Inc., Livingston, N.J.

[21] Appl. No.: 204,626

[22] Filed: Jun. 9, 1988

[51] Int. Cl.[4] .......................... H04N 5/14; G06F 7/38

[52] U.S. Cl. ...................................... 358/160; 358/12; 358/133; 358/141; 358/260; 364/724.13; 364/724.16; 364/724.17; 382/41; 382/43

[58] Field of Search ....................... 358/12, 13, 23, 30, 358/36, 37, 133, 136, 138, 141, 142, 143, 144, 145, 160, 166, 167, 280, 260, 261, 262; 364/724.13, 724.16, 724.17; 382/41, 43

[56] References Cited

U.S. PATENT DOCUMENTS 4,674,125 6/1987 Carlson et al. ................ 364/724.16

4,785,348 11/1988 Fonsalas et al. .................... 358/138

OTHER PUBLICATIONS

IEEE Trans. on Communications; "A Two-Channel Picture Coding System II-Adaptive Compounding and Color Coding"; Schreiber et al, vol. COM-29, No 12 Dec. 1981 pp. 1849-1858.

IEEE Trans. on ASSP; "Subband Coding of Images"; Woods et al, vol.-ASSP-34, No. 5, Oct. 1986 pp. 1278-1288.

IEEE Trans. on ASSP; "Exact Reconstruction Techniques for Tree-Structure Subband Codes"; Smith et al; vol.-ASSP-34 No. 3, Jun. 1986, pp. 434-441.

*Primary Examiner*—Edward L. Coles, Sr.
*Assistant Examiner*—Michael D. Parker
*Attorney, Agent, or Firm*—James W. Falk

[57] ABSTRACT

A class of filters for use in connection with the sub-band coding of a video signal is disclosed. The filters are of short length, symmetric and have coefficients in the form of an integer divided by a power of two. The filters may be implemented with a minimum of circuitry and permit exact reconstruction of a sub-band coded video signal.

8 Claims, 3 Drawing Sheets

11
H2(z)
12a
H3(z)
12b
2:1 DECIMATION
13
H0(z)
14a
H1(z)
14b
16a
16b
18
CODER
19a
19b
19c
19d
TRANSMISSION
17a
17b
17c
17d
10

TRANSMISSION
17a
22a
DECODE
23
INTERPOLATION 1:2
24a
$G_0(z)$
TRANSMISSION
17b
22b
DECODE
23
INTERPOLATION 1:2
24b
$G_1(z)$
25
29
Σ
31
INTERPOLATION 1:2
32
$G_2(z)$
TRANSMISSION
17c
22c
DECODE
23
INTERPOLATION 1:2
26a
$G_0(z)$
TRANSMISSION
17d
22d
DECODE
23
INTERPOLATION 1:2
26b
$G_1(z)$
20
27
30
Σ
31
INTERPOLATION 1:2
33
$G_3(z)$
34
Σ
ORIGINAL SIGNAL

SUB-BAND CODING OF IMAGES WITH LOW COMPUTATIONAL COMPLEXITY

FIELD OF THE INVENTION

The present invention relates to a video signal transmission technique known as sub-band coding. More particularly, the present invention relates to a class of digital filters which permit use of the sub-band coding technique for video signals, such as high definition television signals, with a minimum of computational complexity.

BACKGROUND OF THE INVENTION

Sub-band coding refers to a technique where, by the parallel application of a set of filters, an input signal is decomposed into several narrow bands that are separately decimated and coded for the purpose of transmission. For reconstruction after tranmission, the individual bands are decoded, interpolated and filtered in order to reproduce the original signal. Originally, sub-band coding was developed in connection with the coding and transmission of speech signals. (See e.g. R. E. Crochiere et al. "Digital Coding of Speech in Sub-bands", BSTJ Vol. 55, pp. 1069–1085.)

In the case of a video signal, separable filter banks are applied first horizontally then vertically. Application of a filter bank comprising two filters, first horizontally then vertically, gives rise to an analysis of a video signal in four frequency bands: horizontal low-vertical low; horizontal low-vertical high; horizontal high-vertical low; horizontal high-vertical high. Each resulting band is encoded according to its own statistics for transmission from a coding station to a receiving station.

A very important part of the design of a sub-band code is the choice of the analysis and synthesis filter banks that are used to decompose and reconstruct the original video signal. Much of the design work in filter banks has been motivated by speech processing where sharp band separation is a very desirable property. This work led naturally to finite impulse response (FIR) filter banks with a very large number of stages, e.g. 64. A classical approach to designing such filters is the Quadrature Mirror Filter approach which, in the absence of channel and quantization noise, permits an alias free and near perfect reconstruction of the input signal when the input signal is a one-dimensional speech signal (see. e.g. D. Esteban et al., "Application of Quadrature Mirror Filters to Split Band Voice Coding Schemes", Proc 1977 Int'l IEEE Conf. on ASSP, pp. 191–195). Application of the Quadrature Mirror concept to the sub-band coding of digital images has recently received considerable attention, and the technique has been shown to be highly effective for image compression. (See e.g., M. Vetterli, "Multi-dimensional Sub-band Coding: Some Theory and Algorithms," Signal Processing 6 (1984), pp. 97–112; J. W. Woods and S. O'-Neil, "Sub-Band Coding of Images," Proc. ICASSP 86, pp. 1005–1008, April 1986; H. Gharavi, and A. Tabatabai, "Sub-band Coding of Digital Images Using Two-Dimensional Quadrature Mirror Filter," Proc. SPIE, vol. 707, pp. 51–61, September 1986; J. W. Woods and S. D. O'Neil, "Subband Coding of Images," IEEE Trans. Acoust., Speech, Signal Processing, vol. ASSP-34, pp. 1278–1288, October 1986; H. Gharavi and A. Tabatabai, "Application of Quadrature Mirror Filtering to the Coding of Monochrome and Color Images," Proc. ICASSP 87, vol. 4, pp. 2384–2387; P. H. Westerink, J. Biemond and D. E. Boekee, "Sub-Band Coding of Digital Images Using Predictive Vector Quantization," Proc. ICASSP 87, vol. 3, pp. 1378–1381).

A disadvantage of the classical Quadrature Mirror Approach is that for video signals, the resulting filters do not permit reconstruction of the original video signal to be exact, although amplitude distortion can be made small by using long, multiple stage filters. In addition, use of the long, multiple stage filters provided by the Quadrature Mirror Approach does not provide any significant coding gains and substantially increases hardware complexity. A variety of other filters have been proposed for the sub-band coding of signals (see e.g., M. Smith et al., "Exact Reconstruction Techniques for Tree Structured Subband Codes," IEEE Trans Account, Speech, Signal Processing, vol. ASSP-34, pp. 434–441, June 1986 and M. Vetterli, "Filter Bands Allowing Perfect Reconstruction", Signal Processing, vol. 10, No. 3, pp. 219–244, April 1986). However, these filters have not proven entirely satisfactory for video sub-band coding applications.

Accordingly, it is an object of the present invention to provide filter banks for use in the sub-band coding of video and image signals, which banks comprise filters of short and simple design so that an original signal can be analyzed and synthesized with minimal computational complexity and so that the original signal can be exactly reconstructed without aliasing effects.

SUMMARY OF THE INVENTION

The present invention is a sub-band coding technique for video signals in which the analysis and synthesis filters are of minimal computational complexity. Illustratively, it is an important feature of the present invention that the analysis and synthesis filter banks comprise filters that are symmetric, have eight or less stages, have coefficient in the form of a power of two divided by an integer, and permit substantially exact reconstruction of the original signal. Such filters are particularly easy to implement and require a minimum of high speed circuitry.

DETAILED DESCRIPTION OF THE INVENTION

Figure 1A:
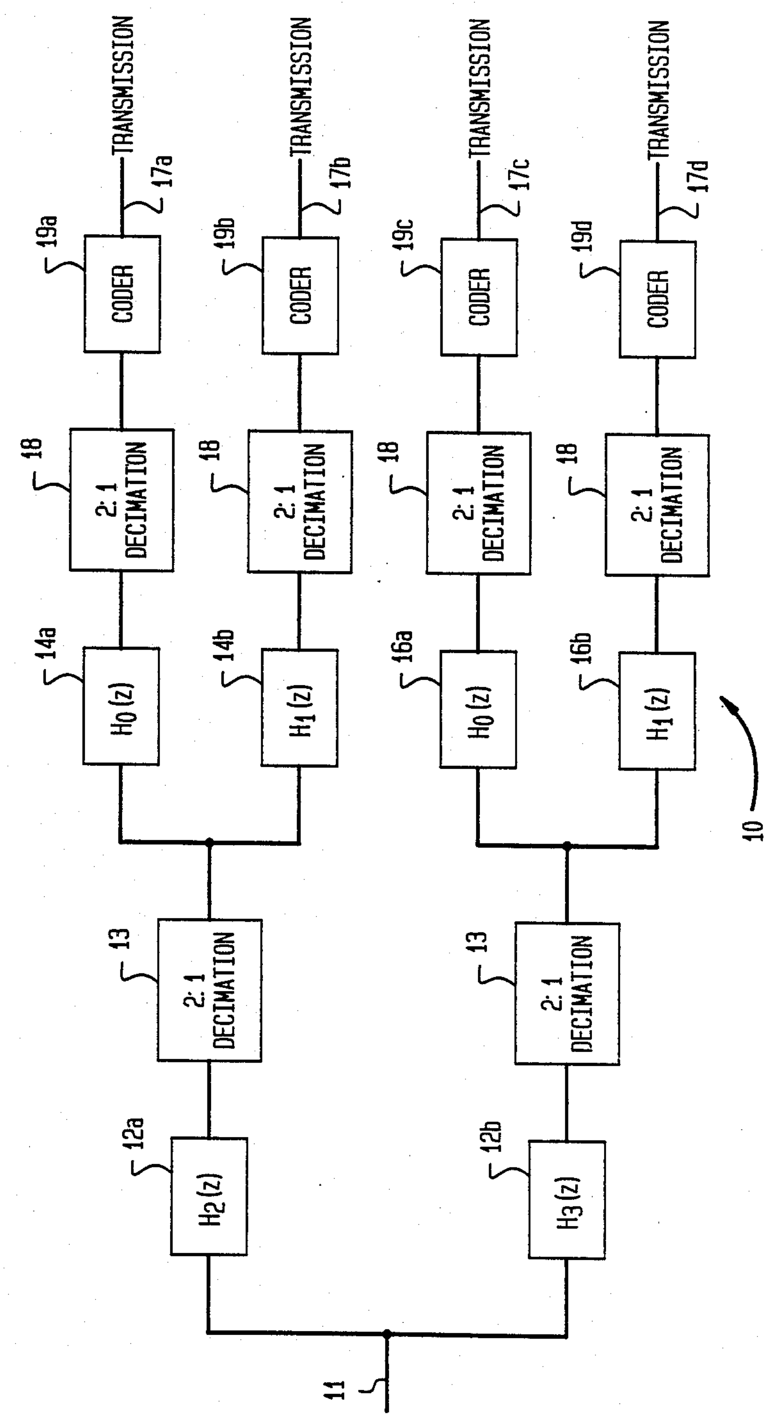
FIGS. 1A and 1B schematically illustrate the transmitting and receiving ends of a sub-band transmission system for video signals wherein a video signal is divided into four sub-bands, in accordance with an illustrative embodiment of the present invention.
Figure 1B:
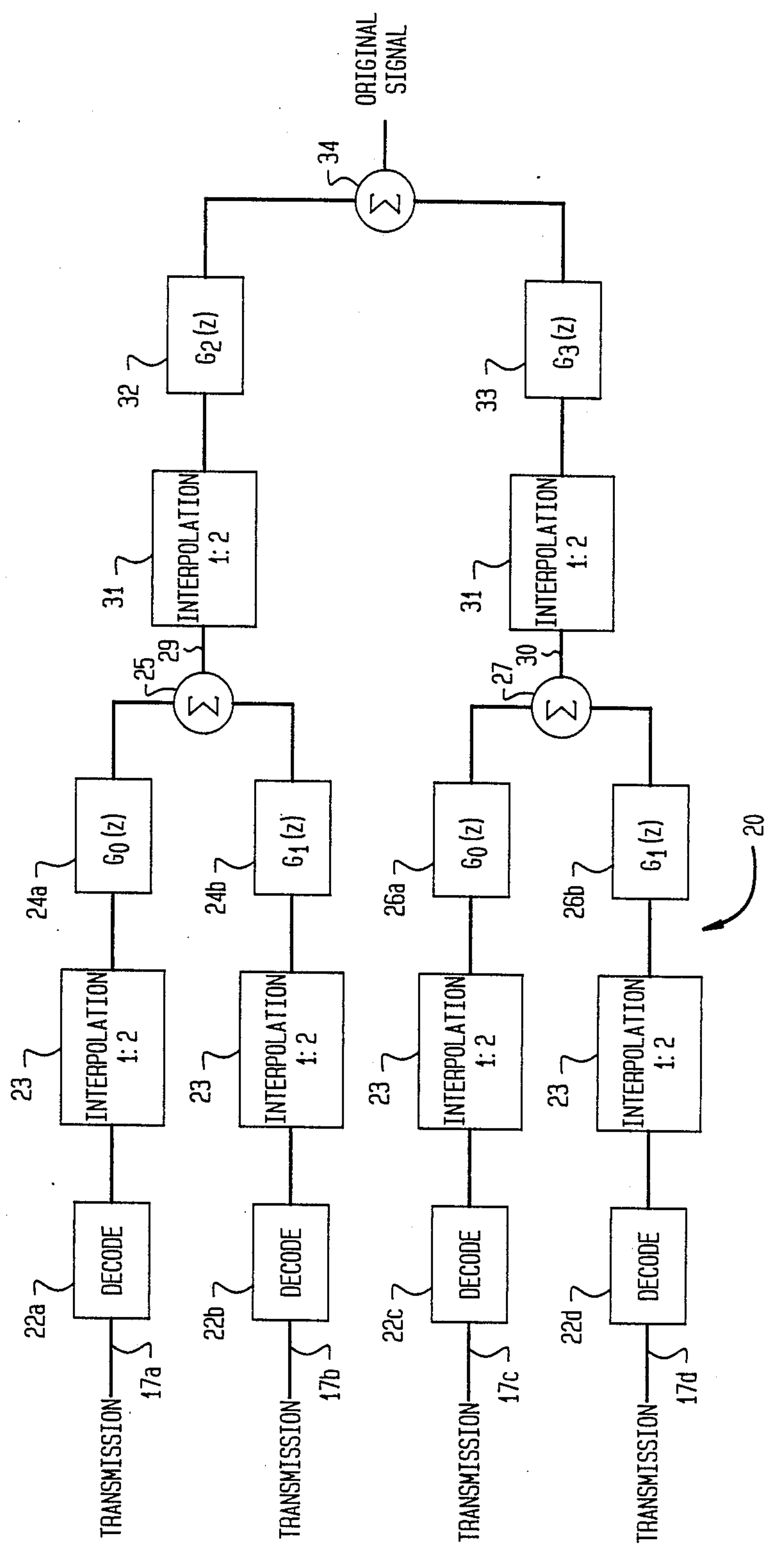

A sub-band video transmission system is schematically illustrated in FIGS. 1A and 1B. FIG. 1A illustrates the transmitting end 10 of the system and FIG. 1B illustrates the receiving end 20 of the system.

A discrete time video signal to be transmitted arrives on line 11. The signal is filtered by the filters **12*a*, 12*b* which have the transfer functions $H_2(z)$ and $H_3(z)$ respectively to divide the signal into two bands, e.g. a horizontal high frequency band and a horizontal low frequency band. The resulting signals are then decimated by decimation operators 13. As used herein the term decimation refers to a signal processing operation wherein some of the sample values comprising a discrete line signal are eliminated. In the decimation operators 13 of FIG. 1, the decimation operation is 2:1. This means that one out of every two samples is removed. In this case, the decimation is critical decimation. Critical decimation takes place when the product of the number of bands and the sample rate before filtering and decimation is equal to the product of the number of bands and the sample rate after filtering and decimation. Thus if filters 12***a*, 12*b* are used to divide the original input signal into two bands, the number of samples per band is reduced in half through decimation.

Each of the sub-bands produced by the filters 12*a*, *b* is then divided into two further sub-bands so that there is a total of four sub-bands. Thus, the sub-band produced by the filter 12*a* is divided into two further sub-bands through use of the vertical filters 14*a*, 14*b* which have the transfer functions, $H_0(z)$ and $H_1(z)$ respectively. Similarly, the sub-band produced by the filter 12*b* is divided into two further sub-bands by the vertical filters 16*a*, 16*b* which have the transfer functions $H_0(z)$, $H_1(z)$ respectively. This results in four sub-bands which are the horizontal low-vertical low frequency band, the horizontal low-vertical high frequency band, the horizontal high-vertical low frequency band, and the horizontal high-vertical high frequency band. Each of the resulting four sub-bands is then critically decimated by means of the decimation operators 18 and then coded by means of coders 19*a, b, c, d* for transmission via lines 17*a, b, c, d* to a remote receiver station such as the remote receiver station 20 of FIG. 1B. In an alternative embodiment of a sub-band coding system, each of the four bands mentioned above, may be divided into further sub-bands.

The four separate sub-band signals of FIG. 1A are coded individually in a conventional manner using the coding devices 19*a*, 19*b*, 19*c*, 19*d*. Most of the information resides in the base band or horizontal low-vertical low frequency band. Thus, the base band contains a significant amount of information all the way to the Nyquist frequency. Accordingly, the base band signal is coded using a known DPCM technique disclosed in H. Gharavi et al. "Sub-band Coding of Digital Images Using Two Dimensional Quadrature Mirror Filtering," Proc. SPIE Vol. 707, pp. 51–61, September 1986. The higher bands which contain significantly less information are coded using a different technique. The higher bands are first quantized and then run length coded. This coding technique for the higher bands is also described in the above identified Gharavi et al. reference.

As shown in FIG. 1B, the coded sub-band signals arrive at the receiver 20 via the lines 17*a, b, c, d*. Each of the sub-band signals is then decoded using the decoding devices 22*a*, 22*b*, 22*c* and 22*d*.

After the individual sub-bands are decoded the original signal is synthesized from the sub-bands. The first step in the synthesis operation is an interpolation step which is carried out by the interpolation operators 23. Interpolation involves increasing the number of samples comprising each sub-band signal by adding samples having a zero value. The number of samples in each of the four sub-bands is increased by a factor of two by the interpolation operators 23. The next step in the synthesis operation is to reduce the number of sub-band signals from four to two. Thus, the sub-band signals on lines 17*a* and 17*b* are processed by the vertical synthesis filters 24*a*, 24*b* having the transfer functions $G_0(z)$, $G_1(z)$, respectively, and are summed by the adder circuit 25. Similarly, the sub-band signals on lines 17*c*, 17*d* are then processed by the vertical synthesis filters 26*a*, 26*b* having the transfer functions $G_0(z)$, $G_1(z)$, respectively, and are summed by the adder circuit 27.

There are now only two sub-band signals, one on line 29 and the other on line 30. Each of the two remaining sub-band signals is then interpolated by the interpolation operators 31 to increase the number of samples, illustratively, by a factor of two. The remaining two sub-band signals are then processed by the filters 32, 33 having transfer functions $G_2(z)$, $G_3(z)$, respectively, and then summed by the adder circuit 34 to reproduce the original video signal.

As indicated above, the analysis and synthesis filter bands may be implemented in accordance with the present invention with a minimum of high speed circuitry so as to permit exact reconstruction of a video signal. To understand how such filters may be implemented, it is useful to consider a one-dimensional system of analysis and synthesis filters. (The two-dimensional case has been discussed above in connection with FIGS. 1A and 1B and comprises the successive application of one-dimensional banks of analysis and synthesis filters). Such a one-dimensional system of analysis and synthesis filters is shown in FIG. 2.

Figure 2:
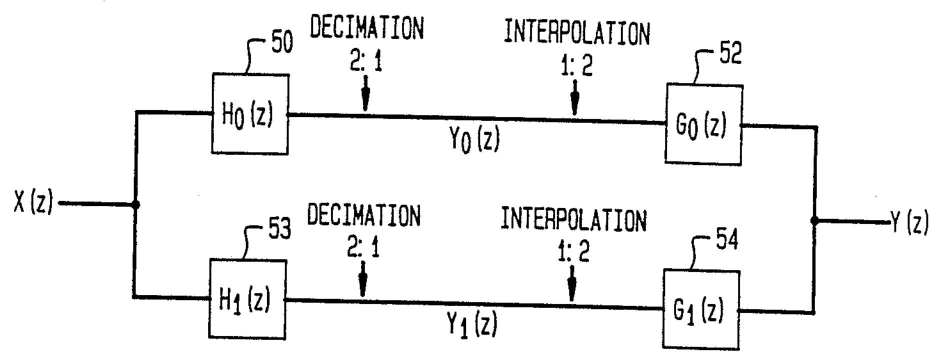
FIG. 2 schematically illustrates a one-dimensional system analysis and synthesis filter banks, in accordance with an illustrative embodiment of the present invention.

As shown in FIG. 2, an input signal $X(z)$ is processed by a pair of analysis filters 50, 52 having transfer functions $H_0(z)$, $H_1(z)$ respectively. The resulting sub-band signals are decimated by a factor of two. At the synthesis side, the signals $Y_0(z)$, $Y_1(z)$ are interpolated (by inserting zeros between successive samples), filtered by the filters 52, 54 having the transfer functions $G_0(z)$, $G_1(z)$, and added to produce the output signal $Y(z)$.

The output signal $Y(z)$ can be written as follows:

$$Y(z)=G_0(z)Y_0(z)+G_1(z)Y_1(z) \quad (1)$$

where, after decimation, $$Y_0(z)=\tfrac{1}{2}[H_0(z)X(z)+H_0(-z)X(-z) \quad (2)$$

$$Y_1(z)=\tfrac{1}{2}[H_1(z)X(z)+H_1(-z)X(-z)] \quad (3)$$

Using these two equations $Y(z)$ can be rewritten as follows:

$$Y(z) = \tfrac{1}{2}[G_0(z)H_0(z) + G_1(z)H_1(z)]X(z) + \tfrac{1}{2}[G_0(z)H_0(-z) + G_1(z)H_1(-z)]X(-z) \quad (4)$$

Aliasing is removed if the synthesis filters are defined as $$G_0(z)=H_1(-z) \quad (5)$$

$$G_1(z)=-H_0(-z) \quad (6)$$

For this class of synthesis filters, perfect reconstruction of the input signal requires that:

$$\Delta(z)=P(z)-P(-z)=2z^{-m} \quad (7)$$

where $$P(z)=H_0(z)H_1(-z) \quad (8)$$

P(z) is known as the product filter and m is the delay introduced by the combination of analysis and synthesis filter banks.

In accordance with the present invention, symmetric short tap filters for the exact reconstruction of sub-band coded video signals are provided by factoring the product filter P(z) and by imposing design constraints on the filter coefficients such as, for example, the filter coefficients are an integer divided by a power of two.

In accordance with the present invention, the product filter P(z) is chosen to be of the form $$P(z) = a_0 + a_2 z^{-2} + \ldots + a_{2p-2} z^{-2p+2} + z^{-2p+1} + a_{2p-2} z^{-2p} + \ldots + a_0 z^{-4p+2} \quad (9)$$

As an illustrative example, consider the case where p=2. In this case, $$P(z)=a_0+a_2z^{-2}+z^{-3}+a_2z^{-4}+a_0z^{-6}$$

One degree of freedom can be suppressed by imposing a double zero at z=1. P(z) can then be factored as $$P(z)=(1+z^{1})(1+z^{-1})(a_0-2a_0z^{-1}+(\tfrac{1}{2}+2a_0)z^{-2}-2a_0z^{-3}+a_0z^{-4}) \quad (10)$$

A value of $a_0$ in the interval $[-\frac{1}{8},0]$ yields useful filter solutions. For $a_0=-1/16$ there is an additional double zero at z=1. In this case the expression for P(z) becomes $$P(z)=1/16(1+z^{-1})^3(-1+3z^{-1}+3z^{-2}-{}^{-3}) \quad (11)$$

The factorization yields two pairs of filters for exact reconstruction of sub-band coded video signals.

The first solution is:

$$H_0(z)=\tfrac{1}{4}(1+3z^{-1}+3z^{-2}+z^{-3}) \quad (12a)$$

$$H_1(z)=\tfrac{1}{4}(-1+3z^{-1}+3z^{-2}-z^{-3}) \quad (12b)$$

The second solution is $$H_0(z)=\tfrac{1}{8}(-1+2z^{-1}+6z^{-2}+2z^{-3}-z^{-4}) \quad (13a)$$

$$H_1(-z)=\tfrac{1}{8}(1+2z^{-1}+z^{-2}) \quad (13b)$$

Note that the first solution comprises filters of equal length while the second solution results in filters of unequal length.

It should be noted that the filters described above are particularly easy to implement and thus particularly suited for the analysis and synthesis of a video signal in a sub-band coding system. First the filters contain only a small number of stages (or taps). For example, the equal length filters of the first solution above comprise three stages each and the unequal filters of the second solution comprise four and two stages respectively. Thus, these filters are short. Second, the filter coefficients are all in the form of an integer divided by a power of two. This means that the filter computation can be carried out using only additions and shifts so that the filters are implemented with a minimum of circuitry. Furthermore, the filters are symmetric which means that the number of additions required for a circuit implementation is reduced. As used herein symmetric means that the first term and the last term in the filter transfer function have the same coefficient, that second term and second to the last term have the same coefficient, etc. If the filter transfer function has an odd number of terms, the filter coefficients are symmetric with respect to a central term. Finally, these filters permit exact reconstruction of a sub-band coded video signals. Accordingly, the above described filters provide a significant improvement over prior art filters used in video sub-band coding systems. It should be noted that the example filters identified above were obtained by setting p=2 in the product filter P(z). Additional short kernel filters may be obtained by setting p=3 or p=4 in the product filter.

Figure 3:
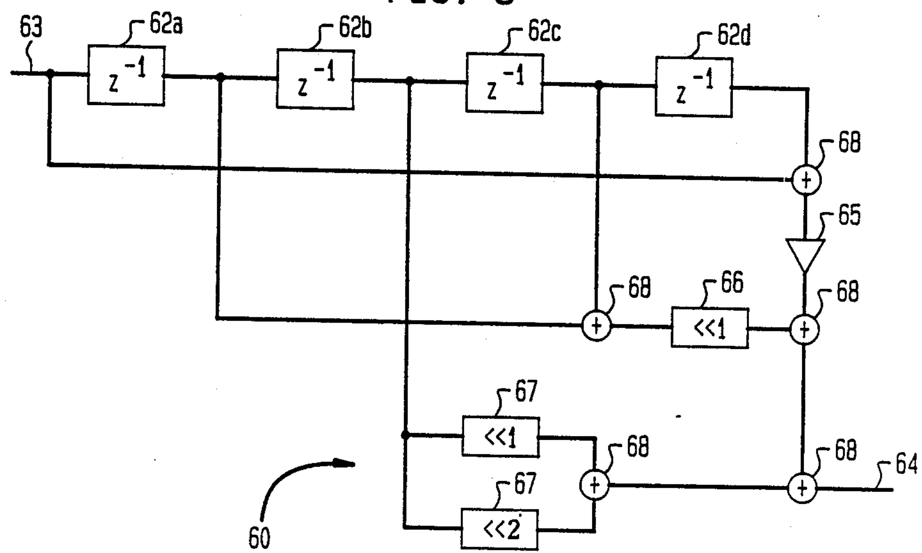
FIG. 3 schematically illustrates a short kernel symmetric filter for use in a sub-band transmission system in accordance with an illustrative embodiment of the present invention.

FIG. 3 schematically illustrates the filter 60 whose transfer function is $H_0(z)=\frac{1}{8}(-1+2z^{-1}+6z^{-2}+2z^{-3}-z^{-4})$. This filter was identified in equation 13(a) above as a factor of P(z) when p is set equal to two. As can be seen in FIG. 3, the filter 60 comprises four stages 62*a*, 62*b*, 62*c*, 62*d*. Each of the stages is a unit delay. An input signal comprising a train of samples is applied to the filter 60 via line 63. The input signal propagates through the filter from one stage to the next. The output signal of the filter is present on line 64. The output signal is formed by adding the present input sample multiplied by a coefficient to the four previous input samples after each has been multiplied by a coefficient. In other words, the filter output is a linear combination of the present input sample and the four previous input samples. Such a filter falls into a family of filters known as finite impulse response filters.

The filter coefficients may be obtained directly from the z transform of the filter transfer function $H_0(z)$. In the z transform of the filter transfer function the $z^{-1}$ term represents a one unit delay, $z^{-2}$ represents a two unit delay, the $z^{-3}$ then represents three unit delay and the $z^{-4}$ term represents a four unit delay. Thus, the filter coefficient of the present input signal is $-\frac{1}{8}$, the filter coefficient for the previous input signal is 2/8, the filter coefficient of the second previous input sample is 6/8, the filter coefficient of the third previous input sample is 2/8, and the filter coefficient for the fourth previous input sample is $-\frac{1}{8}$. As indicated above, this filter is symmetric. Accordingly, the coefficients of the present input signal and the $z^{-4}$ term are provided by the inverter 65; while the one bit shift operation 66 is used to supply the coefficients for the $z^{-1}$ and $z^{-3}$ terms and the one and two bit shift operations 67 are used to supply the coefficient of the $z^{-2}$ term. The adders 68 are used to add the terms to provide the necessary output signal on line 64.

In short a new class of filters for use in sub-band video coding systems has been disclosed. The filters contain a relatively small number of stages, have coefficients in the form of an integer divided by a power of two and are symmetric so that they may be implemented with a minimal amount of high speed circuitry. In addition, the inventive filters permit exact reconstruction of sub-band coded video signals.

Finally, the above-described embodiments of the invention are intended to be illustrative only. Numerous alternative embodiments have been devised by those skilled in the art without departing from the spirit and scope of the present invention.

What is claimed is:

1. A method for coding video signals comprising the steps of dividing said video signal into a plurality of sub-band signals by applying said video signal to a first plurality of filters each of which is a symmetric finite impulse response filter comprising between three and eight stages and having coefficients which are in the form of an integer divided by a power of two, and reconstructing said video signal by applying said sub-band signals to a second plurality of filters each of which is a symmetric finite impulse response filter comprising between three and eight stages and having coefficients which are of the form of an integer divided by a power of two.

2. The method fo claim 1 wherein said sub-band signals are decimated after processing by said first plurality of filters.

3. The method of claim 2 wherein said sub-band signals are interpolated before being processed by said second plurality of filters.

4. The method of claim 1 wherein said first plurality of filters comprises at least one pair of filters having transfer functions $H_0(z)H_1(z)$ and said second plurality of filters comprises at least one pair of filters having transfer functions $G_0(z)=H_1(-z)$ and $G_1(z)=-H_0(-z)$ whereby said second plurality of filters serves to produce a substantially exact reconstruction of said video signal from said sub-band signals.

5. The method of claim 1 wherein said first plurality of filters comprises three pairs of filters to divide said video signal into four sub-bands and said second plurality of filters comprises three pairs of filters.

6. A device for coding a video signal comprising at least one bank of filters for receiving said video signal and for analyzing said video signal into a plurality of sub-band signals, each of said filters being a symmetric finite impulse response filter having between three and eight stages and having coefficients in the form of an integer divided by a power of two, means for decimating said sub-band signals, and means for separatley coding each of said sub-band signals.

7. The device of claim 6 wherein said device further comprises a second bank of filters for further analyzing said sub-band signals, each of said filters in said second bank being a finite impulse response filter having between three and eight stages and having coefficients in the form of an integer divided by a power of two.

8. A sub-band coding system for a video signal comprising a first filter bank for analyzing said video signal into a plurality of sub-band signals, each of said filters in said first bank being a symmetric finite impulse response filter having between three and eight stages and having coefficients in the form of an integer divided by a power of two, and a second filter bank for synthesizing said video signal from said sub-band signals, each of said filters in said second bank being a symmetric finite impulse response filter having between three and eight stages and having coefficients in the form of an integer divided by a power of two.

* * * * *